(12) United States Patent
Miao

(10) Patent No.: US 11,251,405 B2
(45) Date of Patent: Feb. 15, 2022

(54) ORGANIC LIGHT EMITTING DIODE DISPLAY PANEL WITH BARRIER FILM PACKAGE BAG AND FABRICATING METHOD THEREOF

(71) Applicant: Shenzhen China Star Optoelectronics Semiconductor Display Technology Co., Ltd., Guangdong (CN)

(72) Inventor: Yang Miao, Guangdong (CN)

(73) Assignee: SHENZHEN STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 266 days.

(21) Appl. No.: 16/494,391

(22) PCT Filed: Jun. 3, 2019

(86) PCT No.: PCT/CN2019/089804
§ 371 (c)(1),
(2) Date: Sep. 16, 2019

(87) PCT Pub. No.: WO2020/232748
PCT Pub. Date: Nov. 26, 2020

(65) Prior Publication Data
US 2021/0336219 A1    Oct. 28, 2021

(30) Foreign Application Priority Data
May 17, 2019    (CN) .......................... 201910413388.0

(51) Int. Cl.
*H01L 51/52*    (2006.01)
*H01L 51/00*    (2006.01)
(Continued)

(52) U.S. Cl.
CPC ........ *H01L 51/5259* (2013.01); *H01L 27/322* (2013.01); *H01L 27/3244* (2013.01);
(Continued)

(58) Field of Classification Search
None
See application file for complete search history.

(56) References Cited

U.S. PATENT DOCUMENTS

| | | | |
|---|---|---|---|
| 2002/0113549 A1* | 8/2002 | Yamazaki | H01L 51/5259 313/506 |
| 2003/0027369 A1* | 2/2003 | Yamazaki | H01L 51/0097 438/21 |

(Continued)

FOREIGN PATENT DOCUMENTS

| | | |
|---|---|---|
| CN | 1395323 A | 2/2003 |
| CN | 108962963 A | 12/2018 |
| CN | 109119453 A | 1/2019 |

*Primary Examiner* — Nduka E Ojeh

(57) ABSTRACT

The present invention provides an organic light emitting diode display panel and a fabricating method thereof. The organic light emitting diode display panel includes a lower substrate, having one side extending to form a signal path; an upper cover plate on the lower substrate, wherein a lower surface of the upper cover plate is connected to an upper surface of the lower substrate; and a barrier film package bag enclosing the upper cover plate and the lower substrate from a side away from the signal channel. The method of fabricating the OLED display panel includes following steps: forming a lower substrate; forming an upper cover plate; bonding the upper cover plate to the lower substrate; and packaging the display panel to be packaged by vacuum thermocompression. The present invention simplifies the packaging of the OLED display panel and can meet the package requirements of various types of OLED display panels.

10 Claims, 3 Drawing Sheets

(51) Int. Cl.
*H01L 27/32* (2006.01)
*H01L 51/56* (2006.01)

(52) U.S. Cl.
CPC ...... *H01L 51/0097* (2013.01); *H01L 51/5284* (2013.01); *H01L 51/56* (2013.01); *H01L 2227/323* (2013.01)

(56) References Cited

U.S. PATENT DOCUMENTS

| | | | |
|---|---|---|---|
| 2005/0088088 A1 | 4/2005 | Yamazaki | |
| 2006/0220551 A1 | 10/2006 | Yamazaki | |
| 2011/0253307 A1 | 10/2011 | Lee | |
| 2014/0152950 A1* | 6/2014 | Yeh | G02F 1/1339 349/153 |
| 2015/0061113 A1* | 3/2015 | Vaupel | H01L 23/48 257/734 |
| 2018/0182984 A1* | 6/2018 | Lim | H01L 51/5259 |
| 2018/0210281 A1* | 7/2018 | Liu | G02F 1/136209 |
| 2020/0013967 A1* | 1/2020 | Yamada | H01L 51/0085 |

\* cited by examiner

ORGANIC LIGHT EMITTING DIODE DISPLAY PANEL WITH BARRIER FILM PACKAGE BAG AND FABRICATING METHOD THEREOF

BACKGROUND OF INVENTION

Field of Invention

The present invention relates to a field of display, and in particular, to a large-sized top-emitting flexible organic light-emitting diode display panel and a fabricating method thereof.

Description of Prior Art

Organic light emitting diode (OLED) displays are considered to be flat panel display technology of the next generation due to advantages of self-illuminating, backlight-free, high contrast, wide color gamut, thin thicknesses, wide viewing angles, fast response speeds, and applicability of flexible panels. With development of OLED display technology, OLED display panels continue to expand into the fields of large size, top emission and flexibility. Meanwhile, since service life of the OLED display panel is susceptible to water/oxygen, it is also necessary to continuously innovate package technologies of the OLED display panel so that the panel is not adversely affected by water/oxygen during use.

At present, the existing package technologies of large-sized OLED display panel, such as face seal packaging and dam/getter/fill packaging, are not mature enough in both material and technical aspects when they are applied in the package of a top-emitting flexible organic light-emitting diode display panel.

Therefore, it is necessary to provide a new organic light emitting diode display panel and a fabricating method thereof to overcome the problems of the prior art, and in particular to develop a novel package technology for a large-sized top-emitting flexible organic light emitting diode display panel.

SUMMARY OF INVENTION

An object of the present invention is to provide an organic light emitting diode display panel and a fabricating method thereof, which can simplify package of the organic light emitting diode display panel and meet package requirements of various types of organic light emitting diode display panels.

In order to solve the above problems, an embodiment of the present invention provides an OLED display panel including a lower substrate, having one side extending to form a signal path; an upper cover plate on the lower substrate, wherein a lower surface of the upper cover plate is connected to an upper surface of the lower substrate; and a barrier film package bag enclosing the upper cover plate and the lower substrate from a side away from the signal path.

Further, the lower substrate includes: a first flexible substrate; a thin film transistor layer on the first flexible substrate; a light emitting layer on the thin film transistor layer; and a barrier layer disposed on the thin film transistor layer and completely covering the light emitting layer.

Further, the signal path includes: the first flexible substrate; the thin film transistor layer disposed on the first flexible substrate; and a gel layer disposed on the thin film transistor layer and connected to the barrier layer.

Further, the upper cover plate includes: a second flexible substrate; a color filter layer disposed on the second flexible substrate; and a surface-mounted encapsulation layer disposed on the second flexible substrate and completely covering the color filter layer, wherein the surface-mounted encapsulation layer is configured to connect the upper cover plate and the lower substrate.

Further, the light-emitting layer includes a black matrix layer and red, green, and blue pixel layers, wherein the color filter layer includes: a black photoresist corresponding to the black matrix layer; and red, green, and blue color filter layers corresponding to the red, green, and blue pixel layers.

Further, the first flexible substrate and the second flexible substrate are made of a material including polyimide.

The present invention also provides a method for fabricating an organic light emitting diode display panel, including the following steps: forming a lower substrate, including providing a glass substrate, sequentially fabricating a first flexible substrate, a thin film transistor layer, a light emitting layer, and a barrier layer on the glass substrate to form the lower substrate, wherein the barrier layer is located on the thin film transistor layer and completely covers the light-emitting layer, and one side of the lower substrate extends to form a signal path; forming an upper cover plate, including providing a glass cover plate, sequentially fabricating a second flexible substrate, a color filter layer, and a surface-mounted encapsulation layer on the glass cover plate, wherein the surface-mounted encapsulation layer is located on the second flexible substrate and completely covers the color filter layer; bonding the upper cover plate to the lower substrate, wherein the surface-mounted encapsulation layer of the upper cover plate is bonded to the barrier layer of the lower substrate in a vacuum environment, followed by peeling off the glass substrate and the glass cover plate to form a display panel to be packaged; and packaging the display panel to be packaged by vacuum thermocompression.

Further, in the step of packaging the display panel to be packaged by vacuum thermocompression, the display panel to be packaged is loaded into a barrier film package bag, with one side of the display panel to be packaged adjacent to the signal path exposed; the display panel to be packaged is bonded to the barrier film package bag by vacuum pumping; and the barrier film package bag, the first flexible substrate, the second flexible substrate, and the surface-mounted encapsulation layer are laminated together by thermocompression and the surface-mounted encapsulation layer is thermally cured meanwhile to complete package.

Further, in the step of forming the lower substrate, the light-emitting layer is formed by evaporation or inkjet printing; and the barrier layer is formed by low temperature plasma assisted chemical vapor deposition (PECVD) or atomic layer deposition (ALD).

The present invention has the beneficial effects of providing an organic light emitting diode (OLED) display panel and a fabricating method thereof. First, an OLED is simply packaged by a method of plasma assisted chemical vapor deposition (PECVD) or atomic layer deposition (ALD), and then an upper cover plate is bonded to a lower substrate by using a surface-mounted encapsulation layer. After peeling off the glass lower substrate and the glass upper cover plate, a panel is tightly packaged using a barrier film package bag, so that water/oxygen cannot diffuse from the bonding gap between the upper cover plate and the lower substrate into the OLED device, thereby realizing effective protection of the OLED panel. The present invention simplifies the packaging of the OLED panel by designing the barrier film package bag, and introduces the surface-mounted encapsulation layer to meet the package requirements of various types of organic light-emitting diode display panels, especially for package requirements for large-sized top-emitting flexibility OLED panels.

Figure 1:
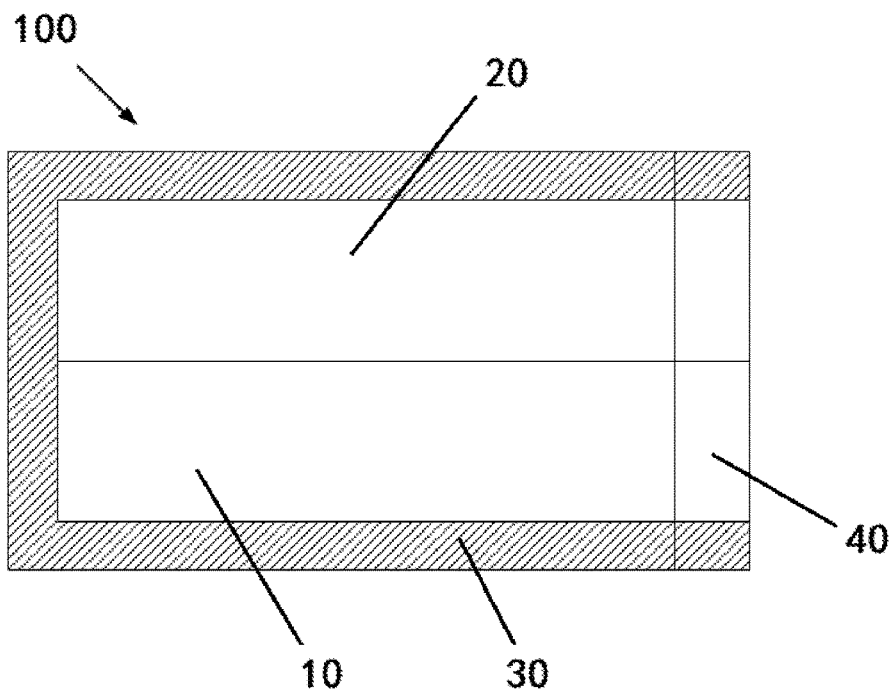
FIG. 1 is a schematic structural view of an organic light emitting diode display panel, according to an embodiment of the present invention.

Elements in the drawings are designated by reference numerals listed below:
100, organic light emitting diode display panel
1, glass substrate
2, glass cover plate
10, lower substrate
20, upper cover plate
30, barrier film package bag
40, signal path
11, first flexible substrate
12, thin film transistor layer
13, light-emitting layer
14, barrier layer
15, gel layer
21, second flexible substrate
22, color filter layer
23, surface-mounted encapsulation layer
131, black matrix layer
132, red, green, and blue pixel layers
221, black photoresist layer
222, red, green, and blue color filter layers

DETAILED DESCRIPTION OF PREFERRED EMBODIMENTS

In the present invention, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

In the present invention, the same or corresponding components are denoted by the same reference numerals regardless of the figure numbers, and throughout the specification, when the terms "first", "second", and the like are used to describe various components, these components are not necessarily limited to the above terms. The above terms is only used to distinguish one component from another.

Referring to FIG. 1, an embodiment of the present invention provides an organic light emitting diode display panel 100 including a lower substrate 10, an upper cover plate 20, and a barrier film package bag 30. One side of the lower substrate 10 extends to form a signal path 40; the upper cover plate 20 is located on the lower substrate 10, and a lower surface of the upper cover plate 20 is connected to an upper surface of the lower substrate 10. The upper cover plate 20 and the lower substrate 10 are packaged on a side of the barrier film package bag 30 far away from the signal path 40. The barrier film package bag 30 acts as a barrier to water/oxygen, solving the problem that water/oxygen easily enters the organic light emitting diode display panel 100 from the bonding gap between the upper cover plate 20 and the lower substrate 10 of the OLED panel, and as a bag structure which facilitates packaging operation and reduces packaging difficulty.

Figure 2:
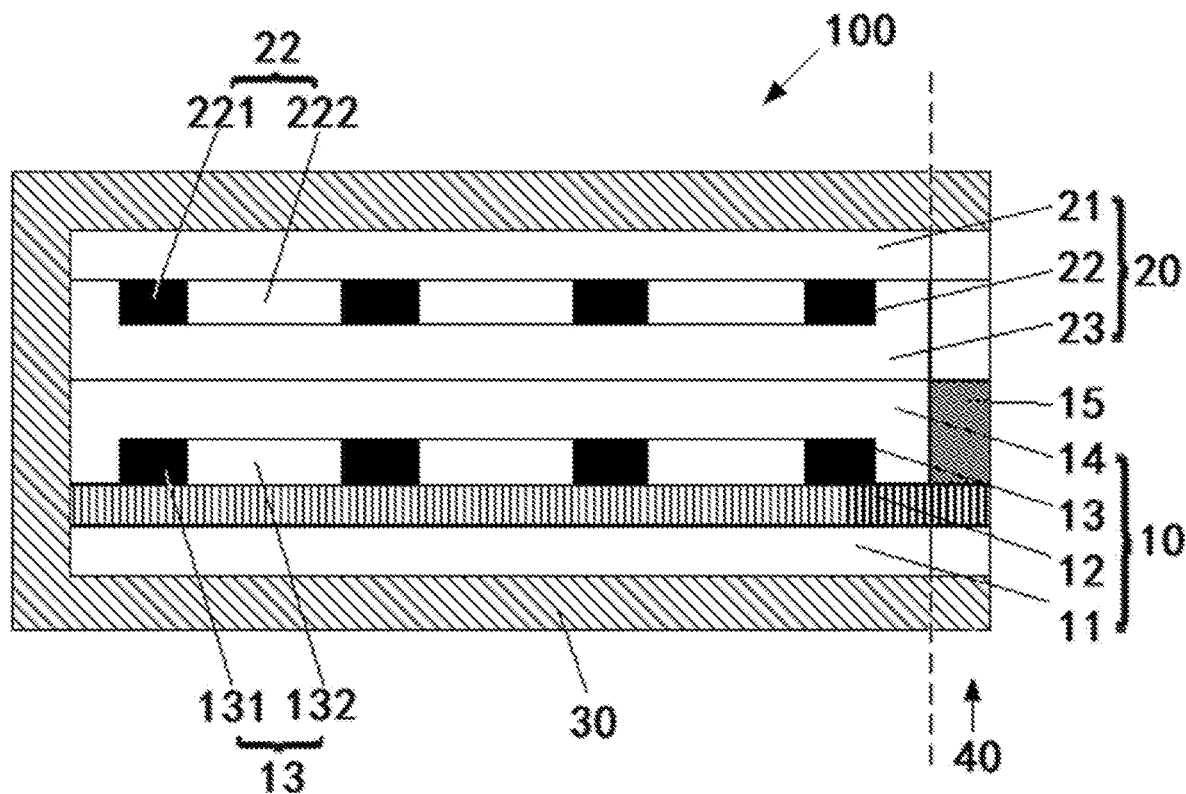
FIG. 2 is a schematic structural view of layers of an organic light emitting diode display panel according to an embodiment of the present invention.
Figure 3:
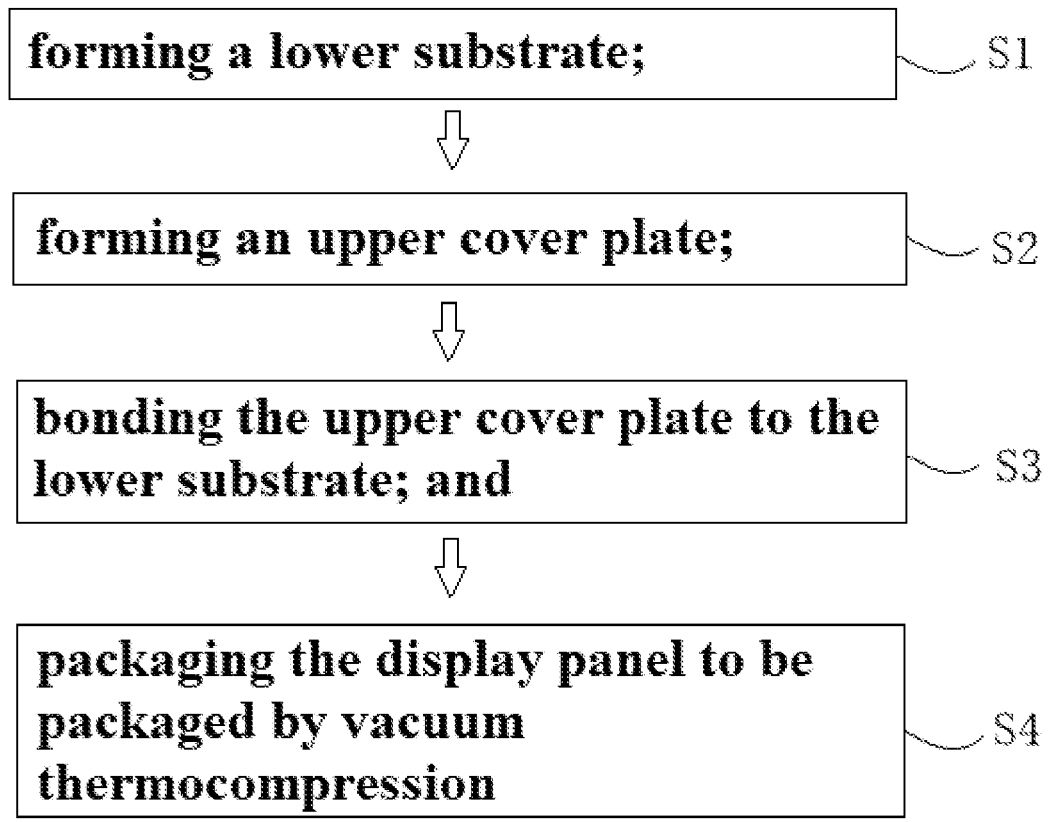
FIG. 3 is a flow chart of fabricating an organic light emitting diode display panel according to an embodiment of the present invention.

Referring to FIG. 2, in the embodiment, the lower substrate 10 includes a first flexible substrate 11, a thin film transistor layer 12, a light emitting layer 13, and a barrier layer 14 which are sequentially disposed. Specifically, the thin film transistor layer 12 is located on the first flexible substrate 11; the light emitting layer 13 is located on the thin film transistor layer 12; and the barrier layer 14 is located on the thin film transistor layer 12 and completely covers the light emitting layer 13. The barrier layer 14 serves as a package structure to block water/oxygen, so that the lower substrate 10 can be used as a simple packaged OLED panel.

Referring to FIG. 2, in the embodiment, the signal path 40 includes the first flexible substrate 11, the thin film transistor layer 12 and a gel layer 15 which are sequentially disposed. In particular, the thin film transistor layer 12 is located on the first flexible substrate 11, and the gel layer 15 is located on the thin film transistor layer 12 and connected to the barrier layer 14.

Referring to FIG. 2, in the embodiment, the upper cover plate 20 includes a second flexible substrate 21, a color filter layer 22, and a surface-mounted encapsulation layer 23 disposed in sequence. In particular, the color filter layer 22 is located on the second flexible substrate 21; and the surface-mounted encapsulation layer 23 is located on the second flexible substrate 21 and completely covers the color filter layer 22. The surface-mounted encapsulation layer 23 is configured to connect the upper cover plate 20 and the lower substrate 10.

Referring to FIG. 2, in the embodiment, the light emitting layer 13 includes a black matrix layer 131 and red, green, and blue pixel layers 132. The color filter layer 22 includes black photoresist corresponding to the black matrix layer 131. The barrier layer 221 and the red, green, and blue filter layers 222 are disposed corresponding to the red, green, and blue pixel layers 132. That is, the light emitting 13 is disposed correspondingly to the color filter layer 22, and the black photoresist layer 221 functions to prevent light mixing, and the red, green, and blue pixel layers 222 function to filter the red, green, and blue pixel layers 132.

In this embodiment, the first flexible substrate 11 and the second flexible substrate 21 are made of materials including polyimide. The materials including polyimide can be laminated together with the barrier film package bag 30 by thermocompression.

Referring to FIG. 3 to FIG. 6, the present invention further provides a method for fabricating the OLED display panel 100, including steps S1 to S4.

S1, forming the lower substrate 10. Specifically, a glass substrate 1 is provided, on which the first flexible substrate 11, the thin film transistor layer 12, the light-emitting layer 13, and the barrier layer 14 are sequentially formed to form the lower substrate 10. The barrier layer 14 is located on the thin film transistor layer 12 and completely covers the light emitting layer 13, wherein a side of the lower substrate 10 extends to form a signal path 40.

Figure 4:
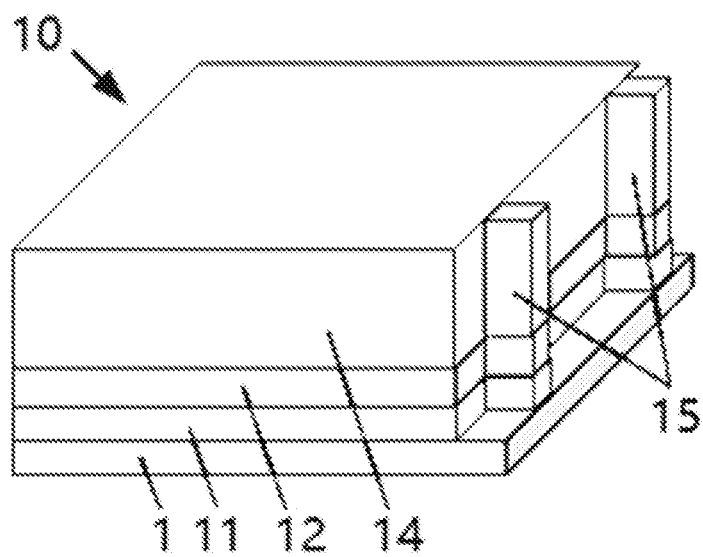
FIG. 4 is a schematic structural view of the structure after completing step S1 in FIG. 3.

Please refer to FIG. 4, which is a schematic structural view of the structure after completing the step S1.

S2, forming an upper cover plate 20. Specifically, a glass cover plate 2 is provided, and a second flexible substrate 21, a color filter layer 22 and a surface-mounted encapsulation layer 23 are sequentially formed on the glass cover plate 2, and the surface-mounted encapsulation layer 23 is located on the second flexible substrate 21 and completely covers the color filter layer 22; wherein the surface-mounted encapsulation layer 23 is formed specifically by: peeling off a protective film on a side of the surface-mounted encapsulation layer 23 and bonding the surface-mounted encapsulation layer 23 to the color filter layer 22 in a vacuum environment.

Figure 5:
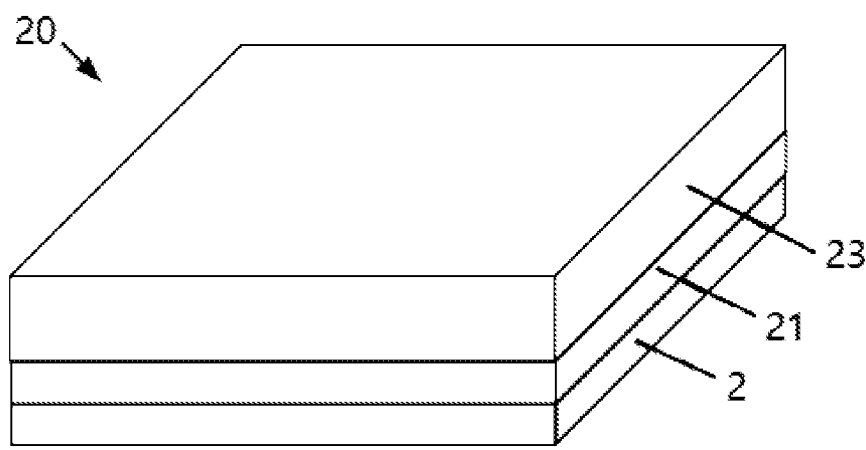
FIG. 5 is a schematic structural view of the structure after completing step S2 in FIG. 3.

Please refer to FIG. 5, which is a schematic structural view of the structure after completing the step S2.

S3, bonding the upper cover plate 20 to the lower substrate 10. Specifically, the protective film on another side of the surface-mounted encapsulation layer 23 is peeled off, and the surface-mounted encapsulation layer 23 of the upper cover plate is bonded to the barrier layer 14 of the lower substrate 10 in a vacuum environment. After the bonding is completed, the glass substrate 1 and the glass cover plate 2 are peeled off to form a display panel to be packaged.

Figure 6:
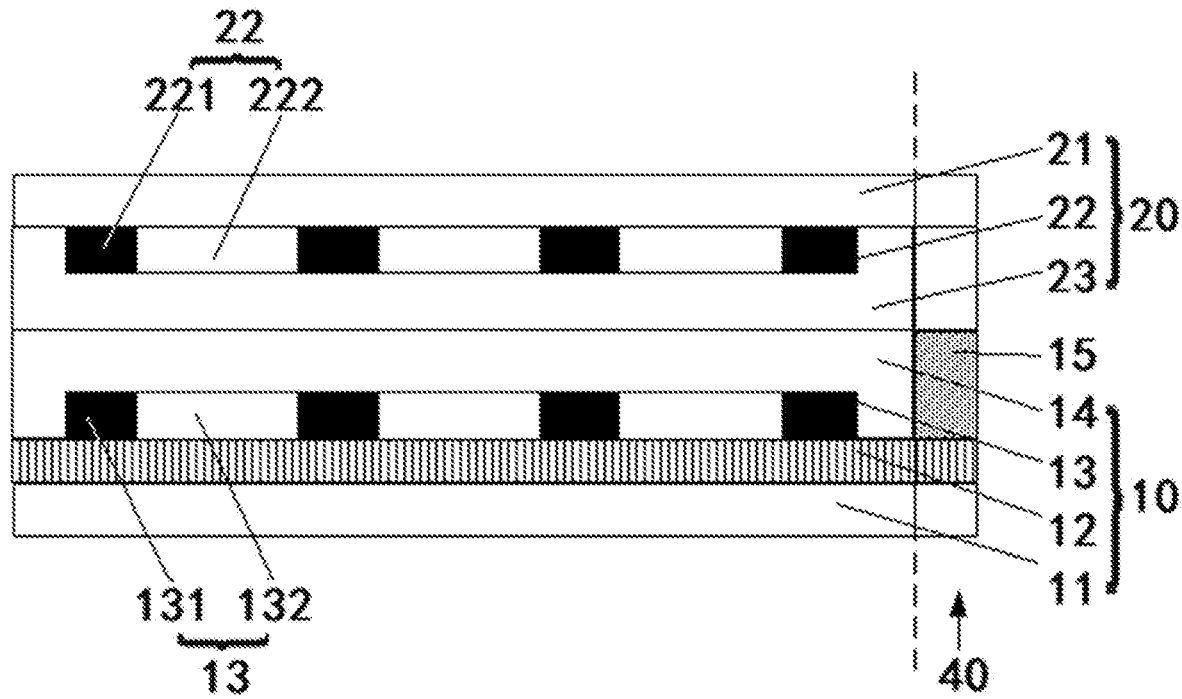
FIG. 6 is a schematic structural view of the structure after completing step S3 in FIG. 3.

Please refer to FIG. 6, which is a schematic structural view of the structure after completing the step S3.

S4, packaging the display panel to be packaged by vacuum thermocompression.

Specifically, in the step S4 of packaging the display panel to be packaged by vacuum thermocompression, the display panel to be packaged is loaded into a barrier film package bag 30, with one side of the display panel to be packaged adjacent to the signal path 40 exposed; the display panel to be packaged is bonded to the barrier film package bag 30 by vacuum pumping; and the barrier film package bag 30, the first flexible substrate 11, the second flexible substrate 12, and the surface-mounted encapsulation layer 23 are laminated together by thermocompression and the surface-mounted encapsulation layer is thermally cured meanwhile to complete package.

Please refer to FIG. 2, which is a schematic structural view of the structure after completing the step S4.

In this embodiment, in the step S1 of forming the lower substrate 10 further includes: forming a gel layer 15 on the thin film transistor layer 12 located in the signal path 40, wherein the gel layer 15 is connected to the barrier layer 14.

In this embodiment, in the step S1 of forming the lower substrate 10, the light-emitting layer 13 is formed by evaporation or inkjet printing; and the barrier layer 14 is formed by low temperature plasma assisted chemical vapor deposition (PECVD) or atomic layer deposition (ALD).

In this embodiment, in the method of fabricating the OLED display panel 100, the first flexible substrate 11 and the second flexible substrate 21 are made of materials including polyimide. The materials including polyimide can be laminated together with the barrier film package bag 30 by thermocompression.

The present invention has the beneficial effects of providing an organic light emitting diode (OLED) display panel 100 and a fabricating method thereof. First, an OLED is simply packaged by a method of plasma assisted chemical vapor deposition (PECVD) or atomic layer deposition (ALD), and then an upper cover plate 20 is bonded to a lower substrate 10 by using a surface-mounted encapsulation layer 23. After peeling off the glass lower substrate 1 and the glass upper cover plate 2, a panel is tightly packaged using a barrier film package bag 30, so that water/oxygen cannot diffuse from the bonding gap between the upper cover plate 20 and the lower substrate 10 into the OLED device, thereby realizing effective protection of the OLED panel. The present invention simplifies the packaging of the OLED panel by designing the barrier film package bag 30, and introduces the surface-mounted encapsulation layer 23 to meet the package requirements of various types of organic light-emitting diode display panels 100, especially for package requirements for large-sized top-emitting flexibility OLED panels.

While the present invention has been described by way of example and in terms of the preferred embodiments, it is to be understood that the present invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An organic light emitting diode (OLED) display panel, comprising:
   a lower substrate, having one side extending to form a signal path, wherein the signal path comprises a portion of a thin film transistor layer;
   an upper cover plate on the lower substrate, wherein a lower surface of the upper cover plate is connected to an upper surface of the lower substrate; and
   a barrier film package bag enclosing the upper cover plate and the lower substrate from a side away from the signal path, wherein the barrier film package bag exposes the thin film transistor layer of the signal path.

2. The OLED display panel according to claim 1, wherein the lower substrate comprises:
   a first flexible substrate;
   the thin film transistor layer on the first flexible substrate;
   a light emitting layer on the thin film transistor layer; and
   a barrier layer disposed on the thin film transistor layer and completely covering the light emitting layer.

3. The OLED display panel according to claim 2, wherein the signal path further comprises:
   a portion of the first flexible substrate; and
   a gel layer disposed on the thin film transistor layer and connected to the barrier layer.

4. The OLED display panel according to claim 1, wherein the upper cover plate comprises:
   a second flexible substrate;
   a color filter layer disposed on the second flexible substrate; and
   a surface-mounted encapsulation layer disposed on the second flexible substrate and completely covering the color filter layer, wherein the surface-mounted encapsulation layer is configured to connect the upper cover plate and the lower substrate.

5. The OLED display panel according to claim 1, wherein the light-emitting layer comprises a black matrix layer and red, green, and blue pixel layers, wherein the color filter layer comprises: a black photoresist corresponding to the black matrix layer; and red, green, and blue color filter layers corresponding to the red, green, and blue pixel layers.

6. The OLED display panel according to claim 1, wherein the first flexible substrate and the second flexible substrate are made of a material comprising polyimide.

7. A method of fabricating the OLED display panel according to claim 1, comprising the following steps:
forming a lower substrate, comprising providing a glass substrate, sequentially fabricating a first flexible substrate, the thin film transistor layer, a light emitting layer, and a barrier layer on the glass substrate to form the lower substrate, wherein the barrier layer is located on the thin film transistor layer and completely covers the light-emitting layer, and one side of the lower substrate extends to form a signal path;
forming an upper cover plate, comprising providing a glass cover plate, sequentially fabricating a second flexible substrate, a color filter layer, and a surface-mounted encapsulation layer on the glass cover plate, wherein the surface-mounted encapsulation layer is located on the second flexible substrate and completely covers the color filter layer;
bonding the upper cover plate to the lower substrate, wherein the surface-mounted encapsulation layer of the upper cover is bonded to the barrier layer of the lower substrate in a vacuum environment, followed by peeling off the glass substrate and the glass cover plate to form a display panel to be packaged; and
packaging the display panel to be packaged by vacuum thermocompression.

8. The method of fabricating an OLED display panel according to claim 7, wherein in the step of packaging the display panel to be packaged by vacuum thermocompression, the display panel to be packaged is loaded into the barrier film package bag, with one side of the display panel to be packaged adjacent to the signal path exposed by the barrier film package bag; the display panel to be packaged is bonded to the barrier film package bag by vacuum pumping; and the barrier film package bag, the first flexible substrate, the second flexible substrate, and the surface-mounted encapsulation layer are laminated together by thermocompression and the surface-mounted encapsulation layer is thermally cured meanwhile to complete package.

9. The method of fabricating an OLED display panel according to claim 7, wherein the step of forming the lower substrate further comprises: forming a gel layer on the thin film transistor layer located in the signal path, wherein the gel layer is connected to the barrier layer.

10. The method of fabricating an OLED display panel according to claim 7, wherein in the step of forming the lower substrate, the light-emitting layer is formed by evaporation or inkjet printing; and the barrier layer is formed by low temperature plasma assisted chemical vapor deposition or atomic layer deposition.

* * * * *

UNITED STATES PATENT AND TRADEMARK OFFICE
CERTIFICATE OF CORRECTION

| | |
|---|---|
| PATENT NO. | : 11,251,405 B2 |
| APPLICATION NO. | : 16/494391 |
| DATED | : February 15, 2022 |
| INVENTOR(S) | : Yang Miao |

It is certified that error appears in the above-identified patent and that said Letters Patent is hereby corrected as shown below:

On the Title Page

Item (73) Assignee:
SHENZHEN STAR OPTOELECTRONICS SEMICONDUCTOR DISPLAY TECHNOLOGY CO., LTD., Shenzhen (CN)

Is changed to:
SHENZHEN CHINA STAR OPTOELECTRONICS SEMICONDUCTOR DISPLAY TECHNOLOGY CO., LTD., Shenzhen (CN)

Signed and Sealed this
Seventeenth Day of January, 2023

Katherine Kelly Vidal
*Director of the United States Patent and Trademark Office*